US007860203B1

(12) United States Patent
Shumarayev et al.

(10) Patent No.: US 7,860,203 B1
(45) Date of Patent: Dec. 28, 2010

(54) HIGH-SPEED SERIAL DATA SIGNAL INTERFACE ARCHITECTURES FOR PROGRAMMABLE LOGIC DEVICES

(75) Inventors: Sergey Shumarayev, Los Altos Hills, CA (US); Wilson Wong, San Francisco, CA (US); Tim Tri Hoang, San Jose, CA (US); Thungoc M. Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 953 days.

(21) Appl. No.: 11/725,653

(22) Filed: Mar. 19, 2007

Related U.S. Application Data

(63) Continuation-in-part of application No. 11/256,346, filed on Oct. 20, 2005, now Pat. No. 7,590,207.

(51) Int. Cl.
*H04L 7/00* (2006.01)
(52) U.S. Cl. .................. 375/354; 375/375; 375/220; 375/221; 331/11; 370/516; 365/230.06
(58) Field of Classification Search ................. 375/354
See application file for complete search history.

(56) References Cited

U.S. PATENT DOCUMENTS

| 6,144,675 | A | * | 11/2000 | Wakabayashi et al. | ...... 370/516 |
| 7,167,410 | B2 | * | 1/2007 | Boecker et al. | ........ 365/230.06 |

* cited by examiner

*Primary Examiner*—Shuwang Liu
*Assistant Examiner*—Lihong Yu
(74) *Attorney, Agent, or Firm*—Ropes & Gray LLP

(57) ABSTRACT

A programmable logic device integrated circuit ("PLD") includes high-speed serial interface ("HSSI") circuitry in addition to programmable logic circuitry. The HSSI circuitry includes multiple channels of nominal data-handling circuitry (typically including clock and data recovery ("CDR") circuitry), and at least one channel of nominal clock management unit ("CMU") circuitry (typically including phase-locked loop ("PLL") circuitry or the like). To increase the flexibility with which the channels can be used, the nominal data-handling channels are equipped to alternatively perform CMU-type functions, and the nominal CMU channel is equipped to alternatively perform data-handling functions.

21 Claims, 6 Drawing Sheets

US 7,860,203 B1

HIGH-SPEED SERIAL DATA SIGNAL INTERFACE ARCHITECTURES FOR PROGRAMMABLE LOGIC DEVICES

This is a continuation-in-part of application Ser. No. 11/256,346, filed Oct. 20, 2005 now U.S. Pat. No. 7,590,207, which is hereby incorporated by reference herein in its entirety.

BACKGROUND OF THE INVENTION

This invention relates to programmable logic device integrated circuits ("PLDs"), and more particularly to circuitry on PLDs that can be used for receiving and/or transmitting high-speed serial data signals.

Shumarayev et al. U.S. patent application Ser. No. 11/256,346, filed Oct. 20, 2005 (hereinafter "the Shumarayev et al. reference") shows and describes circuitry of the general type that is of interest in connection with the present invention. (It will be understood by those skilled in the art reading the Shumarayev et al. reference that the output of circuit element 26 is the clock input to circuit element 28, and that the output of circuit element 21 is the data input to circuit element 28 (although this last connection is not actually shown in FIG. 2 of Shumarayev et al.).

The Shumarayev et al. reference shows some respects in which high-speed serial data signal receiver circuitry on a PLD can be modularized so that the various modules in a cluster ("quad") of such modules can be used either as clock and data recovery ("CDR") circuitry or as clock management unit ("CMU") circuitry. For example, if several channels of high-speed serial data are to be received and processed in a coordinated way, each high-speed serial data signal can be applied to a respective one of the modules in a quad that are operated as CDR circuitry, while a reference clock signal is applied to another module in the quad that is operated as CMU circuitry. The CMU module provides clock signals that may be needed by the other modules that are operating as CDR circuitry. Any module in a quad that is not needed for these operations can be operated as stand-alone CMU-type circuitry (e.g., for providing a regulated clock signal for use by other circuitry on the PLD).

The above basic idea of the Shumarayev et al. reference can be extended and/or augmented in various useful ways in accordance with the present invention.

SUMMARY OF THE INVENTION

In accordance with this invention, a programmable logic device ("PLD") may include programmable logic circuitry, a plurality of channels of nominal data-handling circuitry (e.g., "CDR circuitry" or "CDR channels"), and at least one, channel of nominal clock management unit circuitry (e.g., "CMU circuitry" or a "CMU channel). Alternatively, there may be a plurality of CMU channels. Each CDR channel typically includes a data receiver portion and a data transmitter portion. The data receiver portion of each CDR channel typically includes a clock reference loop and a data recovery loop. The CMU channel also includes a clock reference loop and a data recovery loop. Circuitry (e.g., "global circuitry") may be provided for distributing a clock signal output by the clock reference loop of the CMU channel to each of the CDR channels as a global clock signal. Selection circuitry may be associated with each of the CDR channels for selecting either the global clock signal or a clock signal (e.g., a "local clock signal") output by the clock reference loop of that channel for use by the transmitter portion of that channel.

Circuitry that is at least partly hard-wired to perform any of several data-handling functions (e.g., "protocol coding sublayer" or "PCS" circuitry) may be provided on the PLD for processing data passing between each of the above-mentioned channels and the above-mentioned programmable logic circuitry. If such PCS circuitry is included, the PLD may further include routing circuitry for selectively allowing data passing between the channels and the programmable logic circuitry to bypass the PCS circuitry.

If desired, the CMU channel may also include a data transmitter portion. If such a CMU data transmitter portion is provided, further selection circuitry may be provided for allowing the global clock signal to be selected for use by the transmitter portion of the CMU channel.

The PLD typically includes a plurality of device input terminals. Each of these input terminals is typically associated with a respective one of the above-mentioned channels. Still further selection circuitry may be associated with each channel for employing either a reference clock signal or a signal from the input terminal associated with that channel as an input to the clock reference loop of that channel.

The various selection and/or routing circuitries used may be programmably controlled.

Further features of the invention, its nature and various advantages, will be more apparent from the accompanying drawings and the following detailed description.

DETAILED DESCRIPTION

Figure 1:
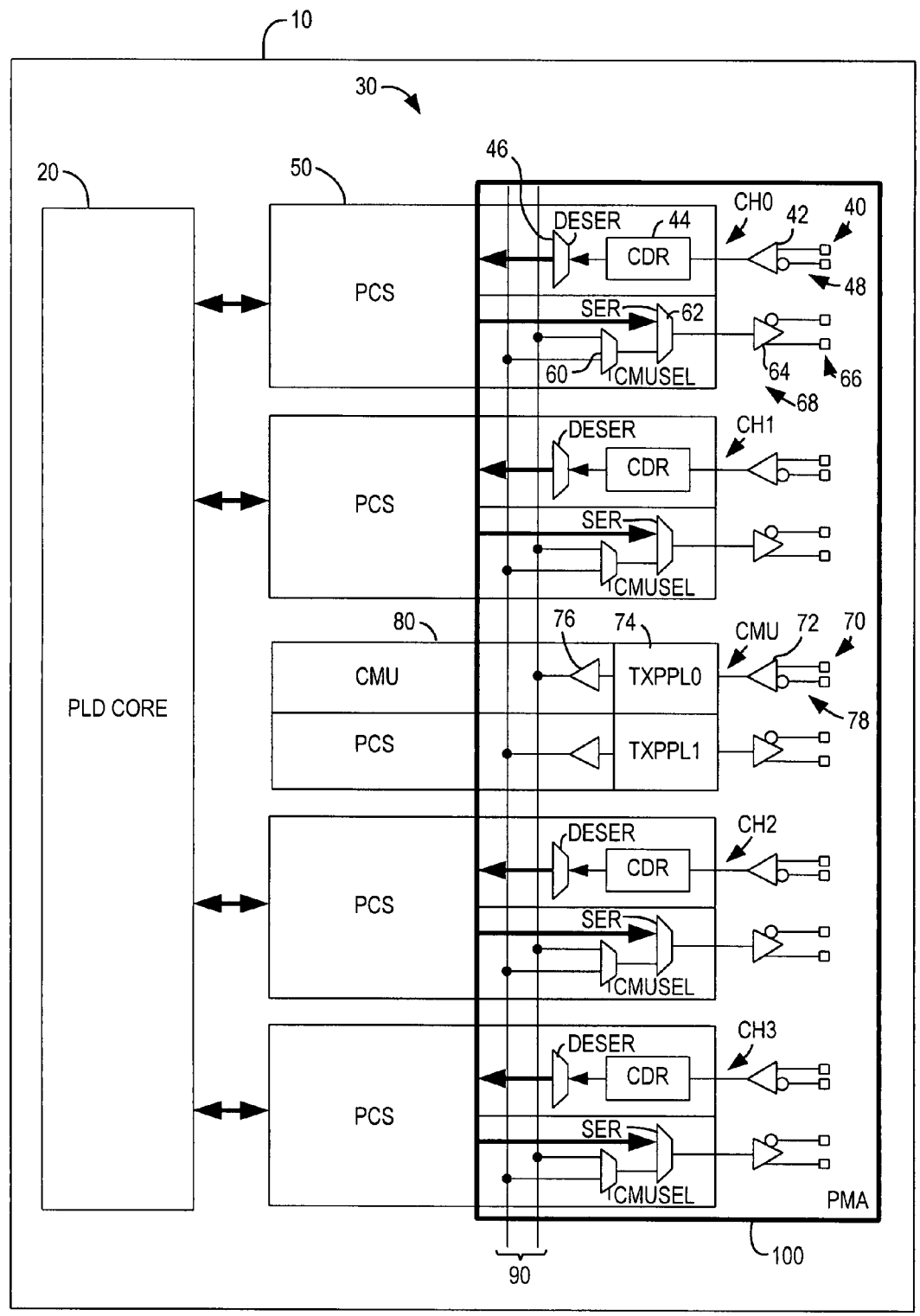
FIG. 1 is a simplified schematic block diagram of illustrative known PLD circuitry.

Illustrative known PLD circuitry 10 is shown in FIG. 1. This circuitry includes PLD core circuitry 20 and one representative quad of high-speed serial interface ("HSSI") circuitry 30. PLD core circuitry 20 includes the general-purpose programmable logic circuitry of the PLD. HSSI circuitry 30 is provided for enabling PLD 10 to receive and/or transmit one or more high-speed serial data signals. The ultimate destination of data received in this way may be PLD core 20. Similarly, the ultimate source of data transmitted in this way may be the PLD core.

Quad 30 is shown as including four channels of high-speed serial transceiver circuitry CH0-CH3, and a block of CMU circuitry. Each transceiver channel CH includes input pins 40, input buffer 42, CDR circuitry 44, deserializer 46, protocol coding sublayer ("PCS") circuitry 50, multiplexer 60, serializer 62, output driver 64, and output pins 66. Elements 40, 42, 44, and 46 may be collectively referred to as the receiver portion 48 of a channel. Elements 60, 62, 64, and 66 may be collectively referred to as the transmitter portion 68 of a channel. The CMU block includes two portions, each of which includes input pins 70, input buffer 72, phase-locked loop ("PLL") circuitry 74, and output driver 76. The CMU block also includes a PCS portion 80. Each set of elements 70, 72, 74, and 76 may be referred to collectively as a PLL channel 78. Each of the two PLL channels 78 in the CMU block applies a regulated clock signal to a respective one of ("global") conductors 90, both of which extend to all of the channels CH0-CH3 in the quad. The multiplexer ("mux") in each channel CH can select either of those ("global") clock signals for use by the serializer 62 of that channel.

The channel (CH) and CMU circuitry (other than PCS portions 50 and 80) described above may be referred to as physical medium (or media) attachment ("PMA") circuitry 100. In contrast to PMA circuitry, which tends to include some analog signal aspects, PCS circuitry 50 and 80 tends to be entirely digital. Examples of PCS circuitry are 8B/10B encoders/decoders, rate matching circuitry, word alignment circuitry, various state machines, and the like.

From a functional standpoint, the receiver portion 48 of each channel CH can receive a serial data signal in differential form via input pins 40. That differential serial data signal is converted to a single-ended serial data signal by input buffer 42. CDR circuitry 44 "recovers" clock and serial data information from the input buffer output signal. Deserializer 46 converts the serial data information to parallel data. PCS 50 does whatever else is necessary for application of the parallel data to PLD core 20.

On the transmitter side 68 of each channel CH, PCS 50 can receive parallel data from PLD core 20. PCS 50 does whatever is necessary to make that parallel data suitable for application to serializer 62. Mux 60 selects a clock signal for use by serializer 62. Serializer 62 converts the parallel data to a serial data signal. Elements 64 and 66 cooperate to output that serial data in differential form.

Figure 2:
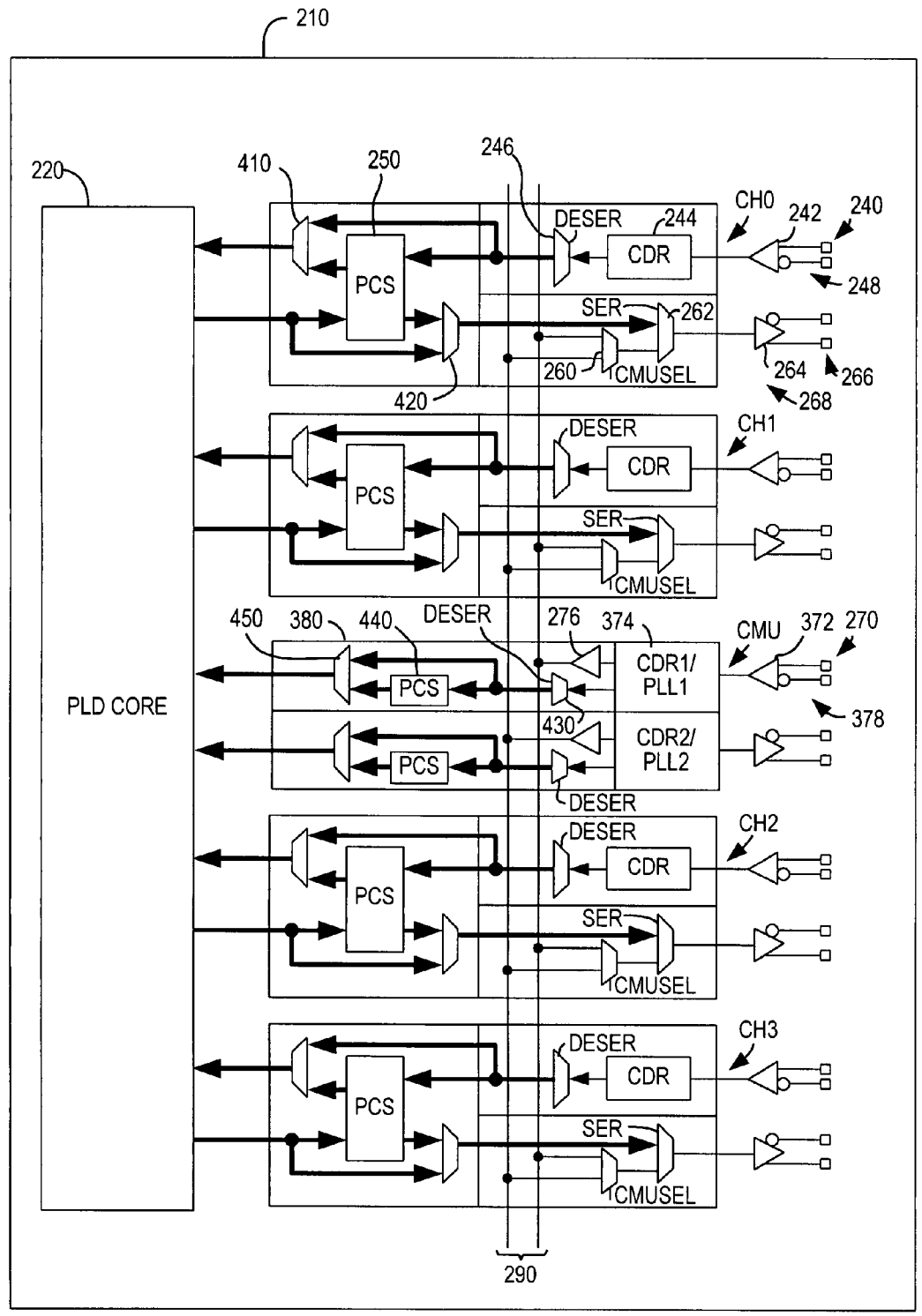
FIG. 2 is a simplified schematic block diagram that is generally similar to FIG. 1, but that shows an illustrative embodiment of circuitry in accordance with the present invention.
Figure 3:
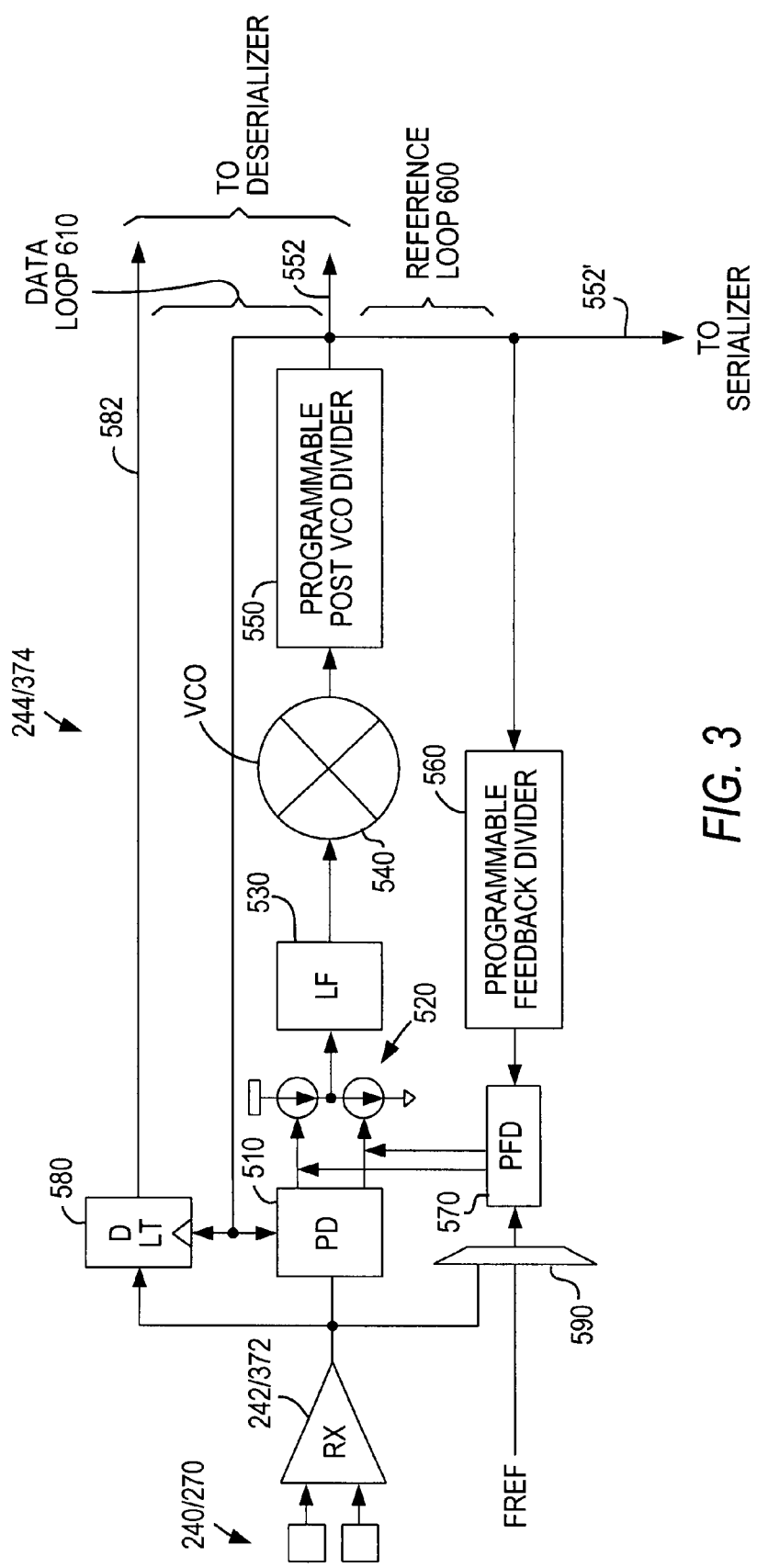
FIG. 3 is a simplified schematic block diagram showing illustrative construction of a representative portion of circuitry of the type shown in FIG. 2 in accordance with the invention.

FIG. 2 shows an illustrative embodiment of PLD circuitry 210 in accordance with the present invention. PLD 210 makes use of some of the principles that are disclosed in the Shumarayev et al. reference, but it also goes beyond what is shown in that reference in several respects. Elements in FIG. 2 that can be the same as or at least generally similar to what is shown in FIG. 1 have reference numbers (in FIG. 2) that are increased by 200 from the reference numbers used for the corresponding elements in FIG. 1. It will not be necessary to describe those elements again in as much detail as was provided above in connection with FIG. 1. Elements in FIG. 2 that are (or that can be) very different from approximate counterparts in FIG. 1 have reference numbers (in FIG. 2) that are increased by 300 from the reference numbers used for the approximately corresponding elements in FIG. 1. Elements in FIG. 2 that have no counterparts in FIG. 1 have reference numbers (in FIG. 2) in the 400 series. In conjunction with FIG. 2, FIG. 3 shows an illustrative embodiment of circuitry that can be used, in the same or substantially the same form, for either elements 240/242/244 or elements 270/372/374. Before continuing with the description of FIG. 2, FIG. 3 will be briefly described. This description of FIG. 3 can be somewhat abbreviated because what is shown in this FIG. can be similar in many respects to what is shown and described in the Shumarayev et al. reference.

In addition to elements 240/270 and 242/372 from FIG. 2, the elements in FIG. 3 are phase detector ("PD") 510, charge pump 520, loop filter ("LF") 530, voltage controlled oscillator ("VCO") 540, programmable post VCO divider 550, programmable feedback divider 560, phase-frequency detector ("PFD") 570, data latch 580, and multiplexer 590. The lower loop 600 in FIG. 3, which includes elements 520, 530, 540, 550, 560, and 570 connected in that order in a closed loop series, may be referred to as a reference loop. The upper loop 610 in FIG. 3, which includes elements 510, 520, 530, 540 and 550 connected in that order in a closed loop series, may be referred to as a data loop. The output of element 550 may be referred to as a retimed clock signal. The output signal of element 242/372 is applied to a data input terminal of data latch 580. This latch is clocked by the retimed clock signal. The output signal of the data latch may be referred to as a recovered data signal. As a whole, circuitry 244/374 in FIG. 3 is CDR circuitry. In other words, this circuitry is operable to recover from a high-speed serial data signal that is applied to input pins 240/270 both a clock signal (output on lead 552) and a serial data signal (output on lead 582). To operate in this way, circuitry 244/374 needs an input reference clock signal Fref, which is applied to PFD 570 via mux 590. Fref does not have to be phase-synchronized with the output signal of element 242/372, but there is typically a known relationship between the frequency of Fref and the data rate of the element 242/372 output signal. The lower loop 600 in FIG. 3 is phase-locked loop ("PLL") circuitry. Without making use of either element 510 or element 580, this lower loop (of elements 570, 520, 530, 540, 550, and 560) can produce a regulated output clock signal on lead 552 that is based on a reference clock signal that is the external (non-loop) input to PFD 570. With circuitry constructed as shown in FIG. 3, this reference clock signal can be either Fref or the output signal of element 342/372. Mux 590 is controllable (e.g., programmably controllable) to select whether Fref or the output signal of element 242/372 will be used as the reference clock input to PFD 570. Again, if the FIG. 3 circuitry is being used as CDR circuitry, mux 590 will typically be controlled to apply Fref to PFD 570. If the FIG. 3 circuitry is being used only as PLL circuitry, mux 590 can be controlled to apply either Fref or the output signal of element 342/372 to PFD 570.

Although the FIG. 3 circuitry is described above as including PLL capability, those skilled in the art will understand that this circuitry can be alternatively constructed as delay-locked loop ("DLL") circuitry. To simplify this discussion, it will be understood that references herein to PLL are generic to embodiments that are actually PLLs, and to alternative embodiments that are actually DLLs.

Returning now to FIG. 2, this FIG. shows that the two CMU PLLs from FIG. 1 are now constructed as CDR channels (e.g., as in FIG. 3). The data loop 610 in these CMU channels 378 is now usable for clock and data recovery if desired. Instead of elements 270 and 372 being used for receiving a reference clock signal for PLL operation (as is the case for elements 70 and 72 in FIG. 1), these elements 270 and 372 can be used to receive a high-speed serial data signal, and to feed that signal into the data loop of CDR 374. This makes additional channels available for CDR, if desired. These additional channels were formerly (e.g., as in FIG. 1) PLL channels only. Note that to support possible use of the CMU channels for CDR, each of these channels now includes deserializer circuitry 430 (similar to any deserializer 246), and PCS circuitry 440 (similar to the in-bound data portion of any PCS 250).

Another operational option available with the FIG. 2/3 architecture is as follows. Any of channels CH0-CH3 can become an individual CMU by letting the output signal of the element 242 in that channel drive the reference loop 600 of that channel.

Recapitulating and expanding on the above, with reference to the embodiment of FIGS. 2 and 3, CMUs 378 can also double as simplified CDRs. Similarly, each CDR can be configured (e.g., by programmable control) as a CMU. Another feature that is shown in FIG. 2 is the ability of the data to bypass the PCS circuitry and go directly into PLD core 20. For example, in-bound data in a channel CH can go to PLD core 20 either via PCS 250 and the lower selectable inputs to mux 410, or via the upper selectable inputs to mux 410 (thereby bypassing PCS 250). Similarly, out-bound data in a channel CH can go to serializer 262 either via PCS 250 and the upper selectable inputs to mux 420, or via the lower selectable inputs to mux 420 (thereby bypassing PCS 250). In a CMU channel that is being used for CDR, in-bound data can go to PLD core 20 either via PCS 440 and the lower selectable inputs to mux 450, or via the upper selectable inputs to mux 450 (thereby bypassing PCS 440). Each of muxes 410, 420, and 450 is preferably programmably controllable to select the desired one of its two selectable sets of inputs. Note that the portion 440 of CMU PCS 380 that has been added to support possible CDR use of each CMU channel can be somewhat simpler than the PCS 250 for a channel CH. For example, PCS portion 440 only needs to support in-bound data. The portion of PCS 250 that is provided for handling out-bound data can be omitted from PCS portion 440. On the other hand, CMU PCS 380 still needs to include the PCS circuitry needed to support possible use of the CMU channel as a central block serving one or more other channels CH. Examples of this other CMU PCS circuitry include XAUI state machine circuitry, PCI Express state machine circuitry, Gigabit Ethernet state machine circuitry, power down and reset circuitry, dynamic configuration circuitry, central transmit clock and divider circuitry, and the like. All of this can be like the CMU PCS circuitry 80 in FIG. 1.

Note that in the embodiment shown in FIG. 2, only the two CMU channels 378 can be used as master PLLs for the other channels CH (i.e., via conductors 290). This may be referred to as "bonding." Thus there is no change (from FIG. 1) to the bonding clock structure or to the related PCS circuitry that supports use of channels CH and a CMU together (i.e., channel bonding in all of its aspects).

Note also that in embodiments like FIGS. 2 and 3, because components 270/372 of CMU channels can be used to receive either a reference clock signal (for CMU operation of the channel) or a high-speed serial data signal (for CDR operation of the channel), these two input possibilities share functionality on these components 270/372 and their downstream (e.g., CDR) components.

If desired, the functionality of components 372 may be reduced as compared to the functionality of components 242. For example, various equalization (e.g., automatic or adaptive equalization) capabilities of components 242 may be omitted from components 372. Thus components 342 may have no equalization capability and/or no adaptive dispersion compensation engine ("ADCE") capabilities.

As a final point in connection with the embodiment shown in FIG. 2, note that the CMU channels have no data output or transmitter capability. Thus the architecture shown in FIG. 2 does not increase the number of "package balls" (I/O pins) PLD 210 requires as compared to PLD 10. However, its flexibility of use is significantly increased because each CMU channel can now be used for CDR, if desired, and each data channel CH can instead be used as a PLL.

Figure 4:
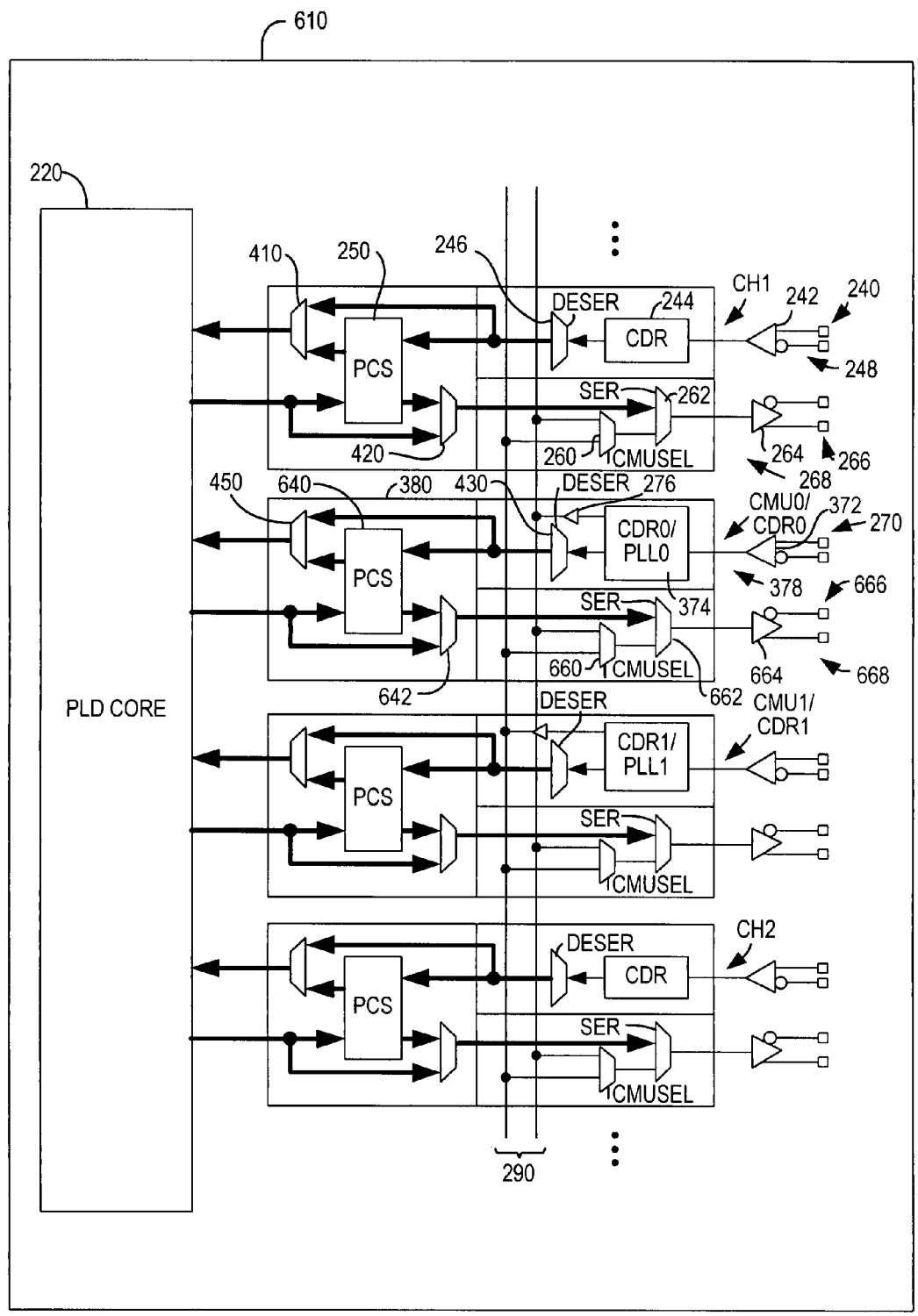
FIG. 4 is similar to FIG. 3 for another illustrative embodiment of the invention.

FIG. 4 shows another illustrative embodiment of a PLD 610 in accordance with this invention. Elements in FIG. 4 that are the same as or similar to elements in FIG. 2 have the same reference numbers in both FIGS. These elements will not need to be described again in connection with FIG. 4. Elements in FIG. 4 that are new or significantly different have reference numbers (in FIG. 4) in the 600 series. Note that FIG. 4 omits depiction of CH0 and CH3 to avoid over-crowding the drawing.

As compared to FIG. 2, the embodiment shown in FIG. 4 gives even more capability to the CMU channels. In particular, whereas the CMU channels in FIG. 2 have only added CDR (receiver) capability, the CMU channels in FIG. 4 also have added transmitter capability. Thus in FIG. 4 the PCS 640 in each CMU channel can support either or both of data reception and data transmission. Out-bound data can bypass CMU PCS 640 via mux 642 if desired. Out-bound parallel data from mux 642 is applied to serializer 662 in the new CMU transmitter circuitry 668. New mux 660 in that circuitry allows the clock signal on either of conductors 290 to be selected for use by serializer circuitry 668. The serial data output by serializer 662 is applied to new output driver 664 and thus to new output pins 666.

In all respects other than those described in the preceding paragraph, the circuitry shown in FIG. 4 can be similar to the FIG. 2 circuitry. Once again, CMUs can also double as simplified CDRs, but now with the additional or alternative capability of data transmission. Data can bypass CMU PCS 640 in either or both directions. If desired, CMU PCS 640 can be somewhat simplified as compared to PCS 250. For example, CMU PCS 640 may only include modules for supporting some of the communication protocols that PCS 250 can support. As in FIG. 2, only the two CMU channels can become master PLLs for bonding multiple data channels. Reference clock and data inputs share functionality on the CMU channel, which may have simplified CDR capability. For example, the RX 372 functionality of these channels may be reduced by including no equalization capability and/or no adaptive dispersion compensation engine ("ADCE") circuitry. As compared to FIG. 2, FIG. 4 adds serializer 662 and TX 664 (which may be somewhat simplified as compared to TX 264). Of course, additional package balls are needed for additional output pins 666.

Figure 5:
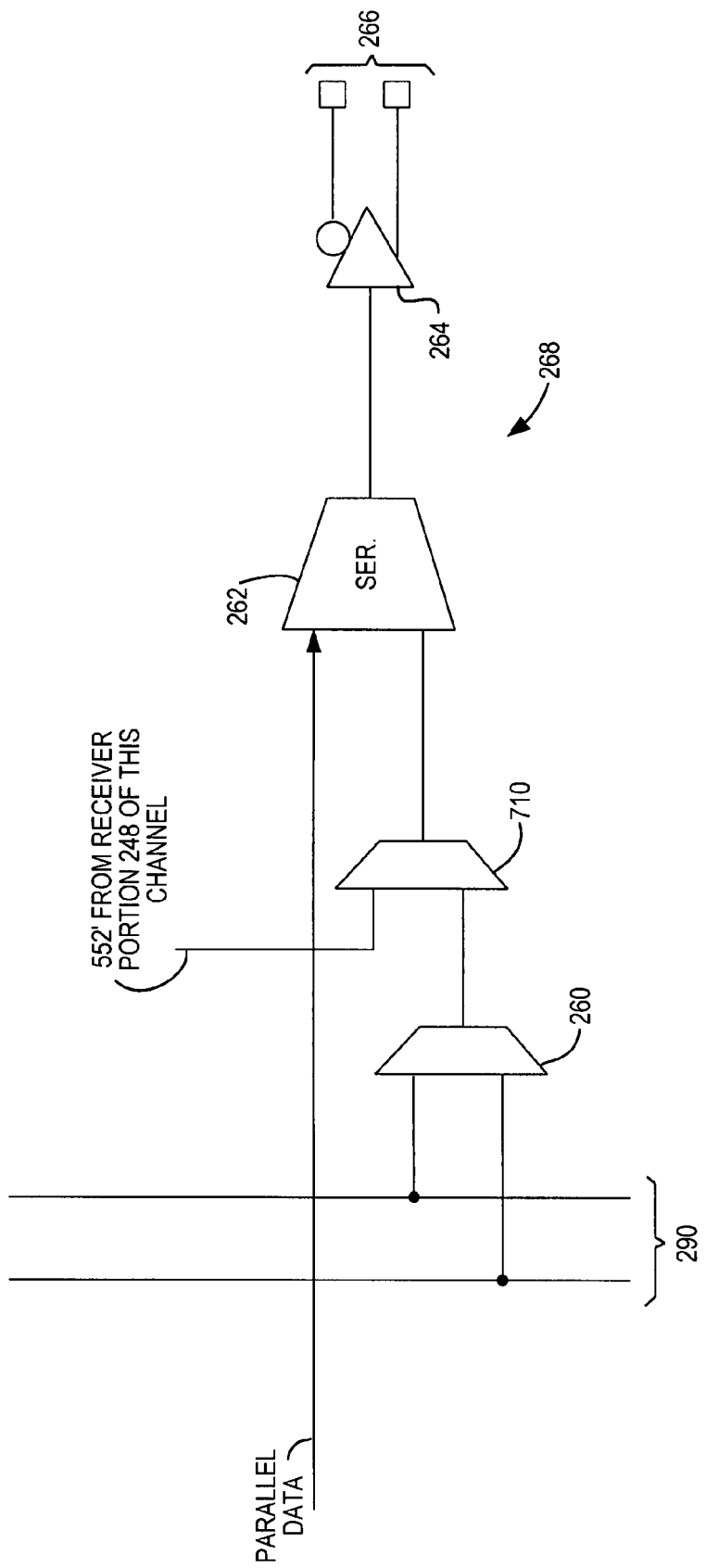
FIG. 5 is a simplified schematic block diagram showing an illustrative embodiment of additional circuitry in accordance with the invention.

Recapitulating and expanding on the above, the invention adds functionality to CDR and/or CMU slices (channels). With respect to CDR slices, the additional connection (FIG. 3) from RX 242 to PFD 570 via mux 590 allows each CDR to become a CMU using the channel's RX 242 as a reference clock source. Such a newly created CMU can be used to drive the PLD as a "cheap" PLL. Another possibility is use of the newly created CMU to drive its own transmitter circuitry 268. This possibility is more fully illustrated in FIG. 5. As FIG. 5 shows, an additional mux 710 can be added between the mux 260 and the serializer 262 is the transmitter portion of 268 of each CDR slice. The second (upper) selectable input 552' to mux 710 is the output 552' of the clock loops in the receiver portion 248 of that same CDR slice. This allows a CDR slice to operate as an independent transmitter, while the receiver portion of that slice is used as a PLL for that independent transmitter operation. Like other muxes shown and described throughout this specification, mux 710 may be programmably controlled to select either of its selectable inputs for use as a clock signal by the associated serializer 262. Still another possible use of a CDR slice is as a repeater. In such a repeater mode, the RX data is recovered by the slice and routed to the TX portion of the slice, while the clock signal 552' recovered by the slice drives the TX portion of the slice. In such repeater operation of a slice, the path of data may be successively through the CDR, deserializer, and serializer of the slice. The routing of the data from the deserializer back to the serializer may be via the associated PCS or via the PLD core. Inclusion of the serializer and deserializer in the repeater path may be desirable as offering complete signal conditioning (e.g., as a result of pre-emphasis available as part of the serializer circuitry). In general, signal conditioning is a feature that is desired for a repeater (e.g., to regain signal quality on a long link).

With regard to additional functionality of CMU slices, the presence of CDR components and the additional connection (FIG. 3) from RX 372 to PFD 570 via mux 590 allows each CMU to become a simplified CDR (using what would otherwise be its reference clock input via elements 270 and 372 as a serial data signal input instead). This newly created CDR channel can be used to drive the PLD as an additional data channel. If (as in FIG. 4) one is willing to devote the required additional area and package balls, one can also get an additional TX path from each CMU slice. Such an additional TX path can be clocked like any other TX path, assuming the TX data comes from the PLD. Alternatively, the RX and TX portions of a CMU slice can be configured as a repeater (similarly to what is shown and described above for FIG. 3). Note that mux 660 allows either of the "global" clock signals on conductors 290 to be used by the transmitter portion 668 of each CMU channel in FIG. 4. If a CMU channel is to be used as a stand-alone data-handling channel, this routing (290/660) allows the transmitter portion of that CMU channel to get its clock signal "locally" from the clock reference loop of that CMU channel. Thus additional routing like 552' (FIG. 3) and 710 (FIG. 5) is not necessary in CMU channels. The same optional "local" functionality is provided in CMU channels by employing routing 290/660 for that purpose if desired. If a CMU channel is used as a repeater, the routing of data through that channel can be similar to the routing described above for other possible repeater operations (i.e., successively through the deserializer and serializer of the CMU channel).

With the addition of transmitter capability to each of CMU channels 270 as in FIG. 4, it is now possible to use a quad of four CDR channels 240 and two CMU channels 270 to send more than four synchronized data signals. In particular by using the same signal 290 to clock all four CDR channels 240 and one or both of the CMU channels 270, five or six synchronized data signals can be transmitted by a quad.

Figure 6:
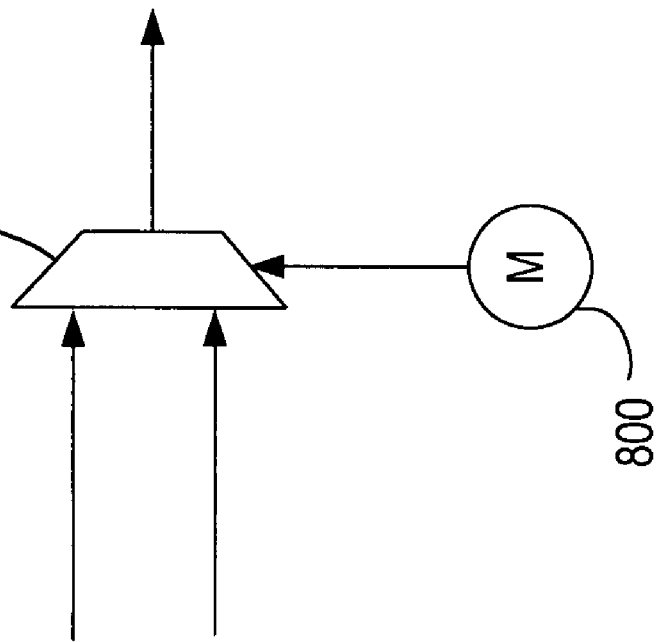
FIG. 6 is a simplified schematic block diagram showing an illustrative embodiment of still more circuitry in accordance with the invention.

FIG. 6 illustrates the point (made at various times earlier in this specification) that control of various signal routing or multiplexer circuit elements can be programmable. Thus FIG. 6 shows a generic multiplexer that can be like any of circuit elements 60, 260, 410, 420, 450, 590, 642, 660, 710, or the like in earlier FIGS. This generic multiplexer is shown as having two selectable inputs (or two sets of selectable inputs) that come in from the left in FIG. 6. The depicted multiplexer can select either of its inputs (or sets of inputs) to be its output(s), depending on the value of the output signal of the associated control circuit element 800. Control circuit element 800 may be a programmable or configurable memory element (e.g., like the configuration memory that is used to control the functions performed by PLD core circuitry 20/220).

Although it has been suggested above that the optional data-handling capabilities of CMU channels can be simplified in various respects, an alternative within the scope of the invention is to give these channels complete PCS and other support for such possible data handling. For example, this full support may include adaptive dispersion compensation and equalization circuitry on the RX side (like that in CDR RX 242), and pre-emphasis circuitry on the TX side (like that in CDR TX 264).

Among the benefits of the invention are that in one quad one can create as many as six data channels instead of only four, or as many six CMUs instead of only two. This provides much greater flexibility and higher channel density.

It will be understood that the foregoing is only illustrative of the principles of the invention, and that various modifications can be made by those skilled in the art without departing from the scope and spirit of the invention. For example, grouping channels in "quads" of four CDR channels and two CMU channels is only an example of how channels may be grouped. Such a group of channels can include more or less than these numbers of each type of channel.

The invention claimed is:

1. A programmable logic device comprising:
   programmable logic circuitry;
   a plurality of channels of nominal data-handling circuitry, each including a data receiver portion and a data transmitter portion, the data receiver portion including a clock reference loop and a data recovery loop;
   at least one channel of nominal clock management unit circuitry including a clock reference loop and a data recovery loop;
   global circuitry for distributing a clock signal output by the clock reference loop of the clock management unit channel to each of the data-handling channels as a global clock signal;
   local circuitry associated with each of the data-handling channels for conveying a clock signal output by the clock reference loop of that channel to the transmitter portion of that channel as a local clock signal; and
   selection circuitry associated with each of the data-handling channels for selecting either the global clock signal or the local clock signal supplied by the local circuitry associated with that channel for use by the transmitter portion of that channel.

2. The device defined in claim 1 further comprising:
   protocol coding sublayer circuitry associated with each of the channels for processing data passing between the associated channel and the programmable logic circuitry; and
   routing circuitry for selectively allowing data passing between each of the channels and the programmable logic circuitry to bypass the protocol coding sublayer circuitry associated with that channel.

3. The device defined in claim 1 wherein the clock management unit channel further includes a data transmitter portion.

4. The device defined in claim 3 further comprising:
   selection circuitry associated with the clock management unit channel for allowing the global clock signal to be selected for use by the transmitter portion of that channel.

5. The device defined in claim 1 wherein the selection circuitry is programmably controlled.

6. The device defined in claim 2 wherein the routing circuitry is programmably controlled.

7. The device defined in claim 4 wherein the selection circuitry associated with the clock management unit channel is programmably controlled.

8. The device defined in claim 1 further comprising:
   a plurality of device input terminals, each of which is associated with a respective one of the channels; and
   further selection circuitry associated with each of the data-handling channels for employing either a reference clock signal or a signal from the input terminal associated with that channel as an input to the clock reference loop of that channel.

9. The device defined in claim 8 further comprising:
   still further selection circuitry associated with the clock management unit channel for employing either a reference clock signal or a signal from the input terminal associated with that channel as an input to the clock reference loop of that channel.

10. A programmable logic device comprising:

programmable logic circuitry;

a plurality of channels of nominal data-handling circuitry ("CDR channels"), each including a data receiver portion and a data transmitter portion, the data receiver portion including a clock reference loop and a data recovery loop;

a plurality of channels of nominal clock management unit circuitry ("CMU channels"), each including a clock reference loop and a data recovery loop;

global circuitry for distributing a clock signal output by the clock reference loop of each CMU channel to each of the CDR channels as a global clock signal;

local circuitry associated with each of the CDR channels for conveying a clock signal output by the clock reference loop of that channel to the transmitter portion of that channel as a local clock signal; and selection circuitry associated with each of the CDR channels for selecting one of the global clock signals or the local clock signal supplied by the local circuitry associated with that channel for use by the transmitter portion of that channel.

11. The device defined in claim 10 further comprising:

protocol coding sublayer ("PCS") circuitry associated with each of the channels for processing data passing between the associated channel and the programmable logic circuitry; and routing circuitry for selectively allowing data passing between each of the channels and the programmable logic circuitry to bypass the PCS circuitry associated with that channel.

12. The device defined in claim 10 wherein each of the CMU channels further includes a data transmitter portion.

13. The device defined in claim 12 further comprising:

selection circuitry associated with each of the CMU channels for selecting one of the global clock signals for use by the transmitter portion of that channel.

14. The device defined in claim 10 further comprising:

programmable circuitry for controlling the selection circuitry.

15. The device defined in claim 11 further comprising:

programmable circuitry for controlling the routing circuitry.

16. The device defined in claim 13 further comprising:

programmable circuitry for controlling the selection circuitry associated with each of the CMU channels.

17. A programmable logic device comprising:

programmable logic circuitry;

a plurality of channels of nominal data-handling circuitry ("CDR channels"), each of which includes a data receiver portion and a data transmitter portion, the data receiver portion including a clock reference loop and a data recovery loop;

at least one channel of nominal clock management unit circuitry ("CMU channel") including a clock reference loop and a data recovery loop;

a plurality of device input pins, each of which is associated with a respective one of the channels;

selection circuitry associated with each of the channels for allowing either a reference clock signal or a signal from the input pin associated with that channel to be used as an input to the clock reference loop of that channel;

circuitry for distributing a clock signal output by the clock reference loop of the CMU channel to each of the CDR channels as a global clock signal; and further selection circuitry associated with each of the CDR channels for selecting either the global clock signal or a local clock signal output by the clock reference loop of that channel for use by the transmitter portion of that channel.

18. The device defined in claim 17 wherein the CMU channel further includes a data transmitter portion, and where the device further comprises:

circuitry for selectively applying the global clock signal to the transmitter portion of the CMU channel.

19. The device defined in claim 1, wherein each of the plurality of channels of nominal data-handling circuitry and the at least one channel of nominal clock management unit circuitry is coupled to the programmable logic circuitry.

20. The device defined in claim 1, wherein:

the clock management unit includes a second clock reference loop;

the global circuitry distributes a second clock signal output by the second clock reference loop to each of the data-handling channels as a second global clock signal; and the selection circuitry is further configured to select the second clock signal.

21. The device defined in claim 1, wherein:

each of the plurality of channels of nominal data-handling circuitry includes a first multiplexer and a second multiplexer;

each of the first multiplexers in each of the plurality of channels is configured to select between the global clock signal and a second global clock signal output by a second clock reference loop of the clock management unit circuitry; and each of the second multiplexers in each of the plurality of channels is configured to select between an output of the first multiplexer and the local clock signal associated with a respective one of the channels.

* * * * *